United States Patent [19]
Hegi

[11] Patent Number: 5,796,659
[45] Date of Patent: Aug. 18, 1998

[54] SEMICONDUCTOR MEMORY DEVICE

[75] Inventor: Yasuhiro Hegi, Kanagawa-ken, Japan

[73] Assignee: Kabushiki Kaisha Toshiba, Kawasaki, Japan

[21] Appl. No.: 876,237

[22] Filed: Jun. 16, 1997

[30] Foreign Application Priority Data

Jun. 21, 1996 [JP] Japan .................. 8-161834

[51] Int. Cl.[6] .................................................. G11C 11/00
[52] U.S. Cl. .................. 365/189.04; 365/189.01; 365/230.06; 365/189.03
[58] Field of Search .................. 365/189.01, 189.04, 365/189.03, 230.01, 230.06

[56] References Cited

U.S. PATENT DOCUMENTS

| | | | |
|---|---|---|---|
| 5,365,482 | 11/1994 | Nakayama | 365/230.06 |
| 5,406,526 | 4/1995 | Sugibayashi et al. | 365/230.06 |
| 5,465,234 | 11/1995 | Hannai | 365/189.05 |
| 5,691,950 | 11/1997 | McClure | 365/230.06 |
| 5,706,244 | 1/1998 | Shimizu | 365/230.03 |

*Primary Examiner*—Viet Q. Nguyen
*Attorney, Agent, or Firm*—Oblon, Spivak, McClelland, Maier & Neustadt, P.C.

[57] ABSTRACT

A SRAM 100, 200 has dedicates address decoders 1 and 2 to select a memory cell 5 in write-in operation, and dedicates address decoders 3 and 4 to select a memory cell 5 during readout operation, and memory cells 5. Only one memory cell 5 is connected to the write-in data line 14 in the write-in operation and to the readout data line 11 in the readout operation, respectively, under the control of the dedicated address decoders.

15 Claims, 3 Drawing Sheets

SEMICONDUCTOR MEMORY DEVICE

BACKGROUND OF THE INVENTION

1. Field of the Invention

The present invention relates to a semiconductor memory devices, and more particularly, relates to a SRAM (a static random access memory) of a single port comprising CMOSs (complementary metal oxide semiconductors).

2. Description of the Related Art

FIG. 1 is a block diagram showing the configuration of a conventional SRAM of a single port comprising CMOSs. In the conventional SRAM shown in FIG. 1, a memory cell 106 on the memory cell matrix is selected by using a row address decoder 101 and a column address decoder 102. Then, data read/out operations are performed between the selected memory cell 106 and a data bus 103 under the control of a I/O control circuit 104.

In a concrete explanation, when data readout operation, a memory cell line connected to the word line 105 selected by the row address decoder 101 is selected, and data items stored in a plurality of memory cells 106 are read to corresponding to the data lines D and /D, respectively. One of the data items stored in the selected memory cells 103 is selected by the column address decoder 102. Then, the selected data item is transferred to the data bus 103 through the I/O control circuit 104 that is in a readout state by a readout enable signal RD.

On the other hand, when data write operation, firstly, a memory cell line connected to the word line 105 selected by the row address decoder 101 is selected, like the data readout operation. Then, a pair of data lines D and /D corresponding to a plurality of selected memory cells enter a conductive state, namely, an active state. The data item for the data write operation transferred to the data bus 103 is provided to the pair of the data lines D and /D selected by the column address decoder 102 through the I/O control circuit 104 in the write operation state controlled by a writing enable signal WR. Thereby, the data item is written into the memory cell 106.

In the conventional SRAM of a single port described above, the difference between the data read operation and the data write operation is only the following: The I/O control circuit 104 reads the stored data item onto the data bus 103 and it transfers the data item provided onto the data bus 103 to the data lines D and /D. Other operations are same between them. Accordingly, it is difficult to perform the data read operation and the data write operation simultaneously. It is thereby difficult to execute high speed read/write operation wherein both the data read operation and the data write operation are executed simultaneously.

In addition, when a memory cell having a bad data storing characteristics is accessed and the data read operation is performed, interference between the data line connected to the memory cell and its memory cell will be caused. This causes to destroy the data item stored in the memory cell. Furthermore, when the data keeping characteristic of the memory cell is increased, the data writing characteristic to the memory cell becomes bad. As described above, it is difficult to design a semiconductor memory device to satisfy the both the requirements to increase the data reading characteristic and the data writing characteristic simultaneously.

As described above, in the conventional SRAM of a single port, it is difficult to execute both the data read operation and the data write operation simultaneously, because the same address decoder to select memory cells is used in both the data read operation and the data write operation, and the operation in which memory cells are connected to data lines after a word line is selected is same in both the data read operation and the data write operation.

SUMMARY OF THE INVENTION

Accordingly, an object of the present invention is, with due consideration to the drawbacks of the conventional semiconductor memory device described above, to provide a semiconductor memory device such as a SRAM of a single port and the like having a highly operation speed in which both the data read operation and the data write operation can be executed simultaneously.

In accordance with a preferred embodiment of the present invention, a semiconductor memory device comprises: a write-in row address decoder for outputting a write-in row selection signal to select a row of a memory cell to which a data item being written when receiving a write-in address signal, a write-in column address decoder for outputting a write-in column selection signal to select a column of the memory cell to which the data item being written when receiving the write-in address signal, a readout row address decoder for outputting a readout row selection signal to select a row of a memory cell from which a stored data item is read when receiving a readout address signal, a plurality of memory cells for storing data, a write-in control circuit for selectively transferring the write-in data item to the write-in data line based on the write-in column selection signal output from the write-in column address decoder, and a readout control circuit for selectively outputting the stored data item, based on the readout column selection signal output from the readout column address decoder, on the readout data line read from the memory cell in the row selected by the readout row selection signal output from the readout row address decoder. Each memory cell comprises a readout column address decoder for outputting a readout column selection signal to select the column of the memory cell from which the stored data item is read when receiving the readout address signal, a flip flops for storing data items, a readout transfer gate, and first and second write-in transfer gates, wherein the readout transfer gate is connected to a readout data line through which the data item stored in the flip flop in the memory cell is read and an output terminal of the flip flop, and the operation of the readout transfer gate is controlled by the readout row selection signal output from the readout row address decoder, the first and second write-in transfer gates are connected between a write-in data line to which a data item to be written into the flip flop is provided and an input terminal of the flip flop, operation of the first write-in transfer gate is controlled by the write-in row selection signal output from the write-in row address decoder, and operation of the second write-in transfer gate is controlled by the write-in column selection signal output from the write-in column address decoder.

In the semiconductor memory device as another preferred embodiment of the present invention, the write-in data line is commonly used for adjacent memory cells.

In accordance with another preferred embodiment of the present invention, a semiconductor memory device comprises a write-in row address decoder for outputting a write-in row selection signal to select a row of a memory cell to which a data item being written when receiving a write-in address signal, a write-in column address decoder for outputting a write-in column selection signal to select a column of the memory cell to which the data item being written when receiving the write-in address signal, a readout row address decoder for outputting a readout row selection signal to select a row of a memory cell from which a stored data item is read when receiving a readout address signal, a readout row address decoder for outputting a readout column selection signal to select a column of the memory cell from which the stored data item is read when receiving the readout address signal, a plurality of memory cells for storing data, a write-in control circuit for selectively transferring the write-in data item to the write-in data line based on the write-in column selection signal output from the write-in column address decoder, and a readout control circuit for selectively outputting the stored data item on the readout data line read from the memory cell based on the readout column selection signal output from the readout column address decoder. Each memory cell comprises a flip flop for storing a data item, first and second readout transfer gates; and first and second write-in transfer gates, wherein the first and second readout transfer gates are connected in series to a readout data line through which the data item stored in the flip flop in the memory cell is read and an output terminal of the flip flop, operation of the first readout transfer gate is controlled by the readout row selection signal output from the readout row address decoder, operation of the second readout transfer gate is controlled by the readout column selection signal output from the readout column address decoder, the first and second write-in transfer gates are connected between a write-in data line to which a data item to be written into the flip flop is provided and an input terminal of the flip flop, operation of the first write-in transfer gate is controlled by the write-in row selection signal output from the write-in row address decoder, and operation of the second write-in transfer gate is controlled by the write-in column selection signal output from the write-in column address decoder.

In the semiconductor memory device as another preferred embodiment of the present invention, the word line is commonly used as the word line through which the readout row selection signal output from the readout row address decoder is provided to the first readout transfer gate and the word line through which the write-in row selection signal output from the write-in row address decoder is provided to the first write-in transfer gate.

In the semiconductor memory device as another preferred embodiment of the present invention, the data line is commonly used as the readout data line and the write-in data line corresponding to the memory cells in adjacent columns.

In the semiconductor memory device as another preferred embodiment of the present invention, each flip flop in the memory cell comprises a first inverter circuit and a second inverter circuit, and a driving ability of the first inverter circuit is greater than a driving ability of the second inverter circuit.

In the semiconductor memory device as another preferred embodiment of the present invention, the write-in control circuit comprising a buffer gate, and the relationship between the buffer gate in the write-in control circuit and the second inverter circuit forming the flip flop in each memory cell is as follows: a mutual conductance "gm" of the buffer gate>a mutual conductance "gm" of the second inverter circuit.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a semiconductor memory device according to the present invention will now be described with reference to the drawings.

First Embodiment

Figure 1:
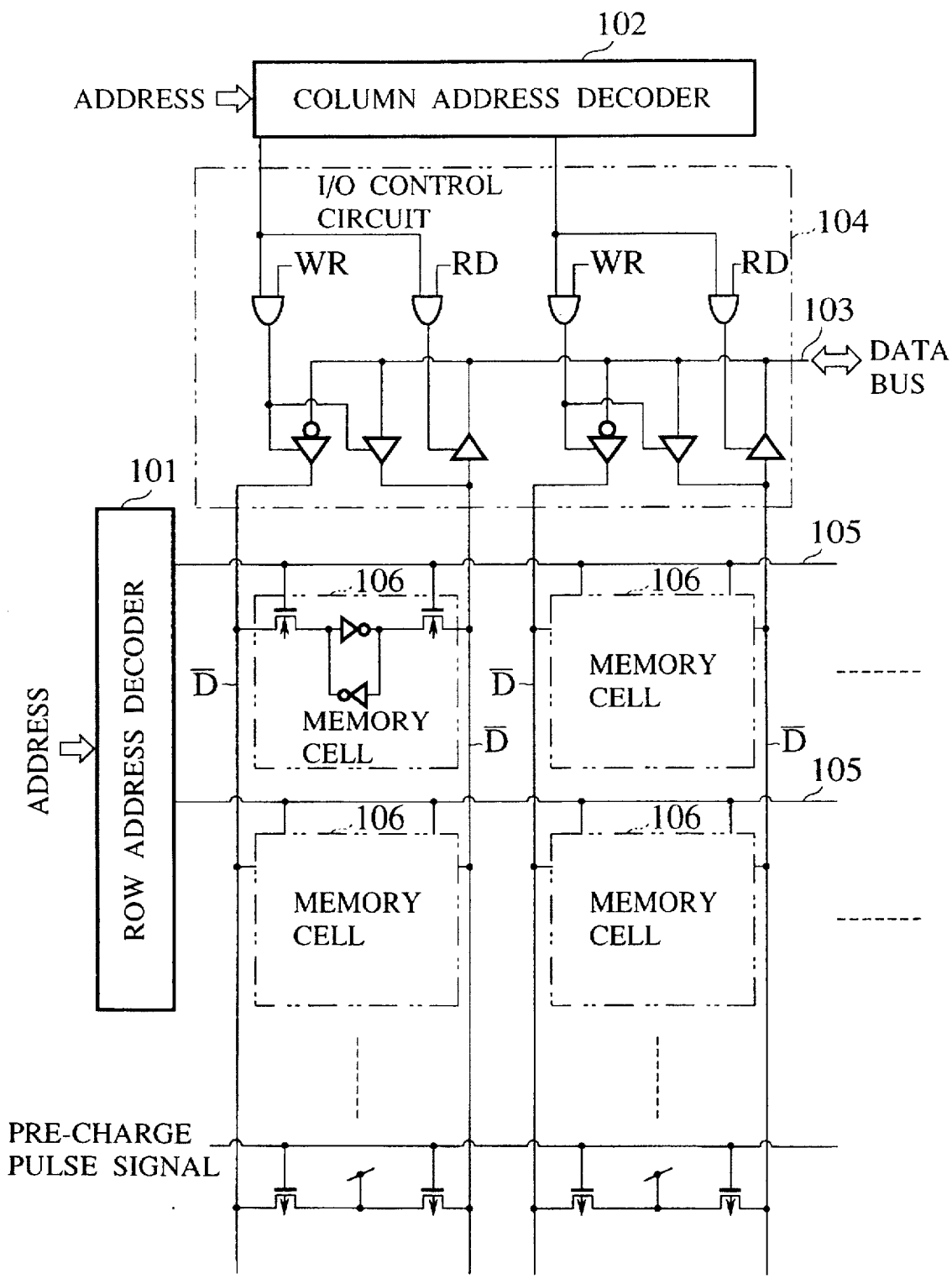
FIG. 1 is a diagram showing a configuration of a conventional SRAM.
Figure 2:
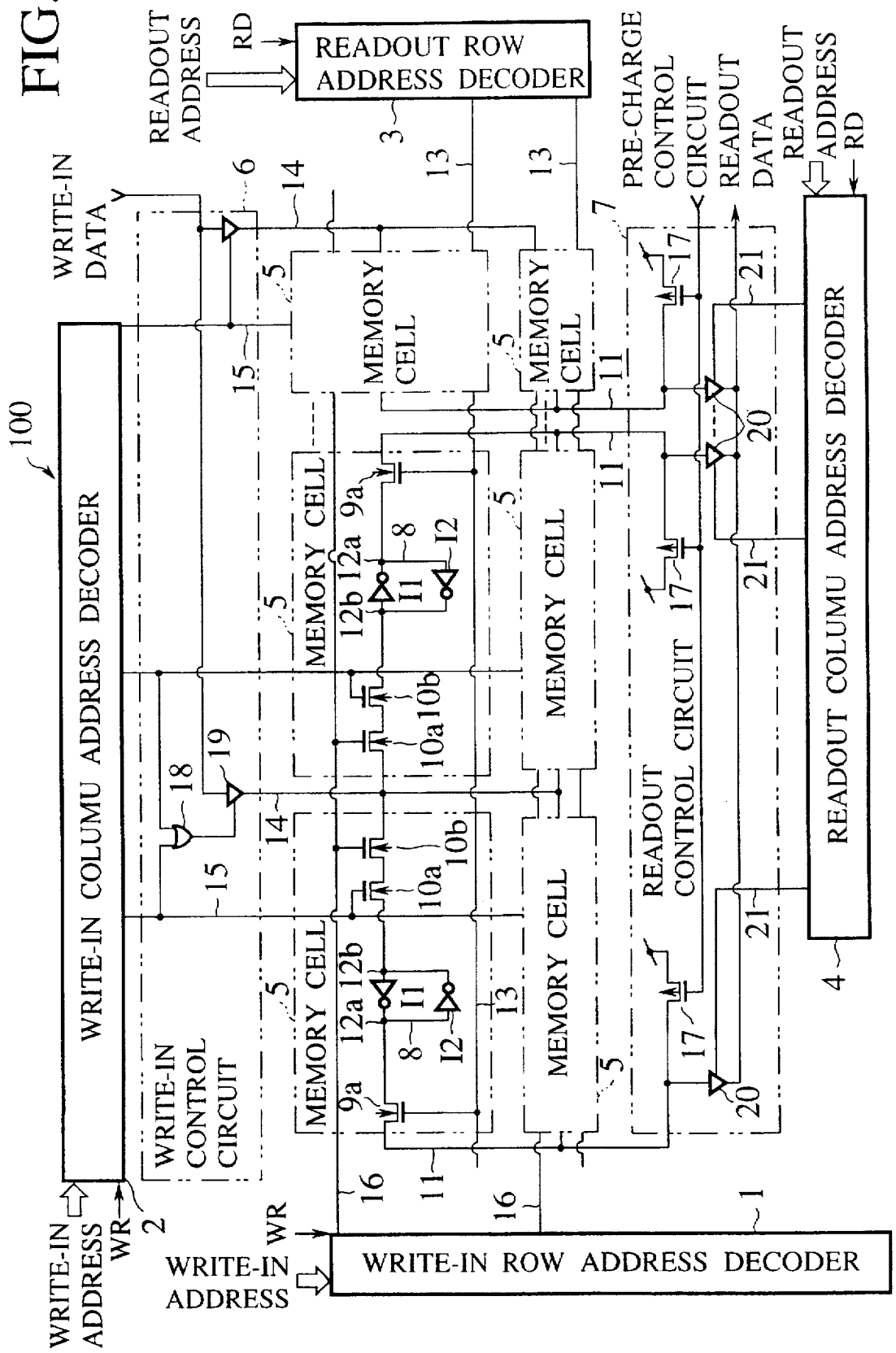
FIG. 2 is a diagram showing a configuration of a semiconductor memory device according to the first embodiment of the present invention.

FIG. 2 is a diagram showing the configuration of a semiconductor memory device 100 according to the first embodiment of the present invention.

The semiconductor memory device 100 according to the first embodiment shown in FIG. 2 is a SRAM (static random access memory) of a single port that is made up of CMOSs (complementary metal oxide semiconductors). It comprises a write-in row address decoder 1, a write-in column address decoder 2, a readout address decoder 3, a readout column address decoder 4, a plurality of memory cells 5, a write-in control circuit 6, and a readout control circuit 7.

The write-in row address decoder 1 inputs a write-in address signal when the write enable signal WR is received, and decodes the write-in address signal, and then outputs a write-in row selection signal to select a line corresponding to the memory cell 5 as a target memory cell to which a data item will be written.

The write-in column address decoder 2 receives the write-in address signal when a write enable signal WR is received, and decodes the write-in address signal, and then outputs a write-in column selection signal to select a column of the memory cell as the target memory cell to which the data item will be written.

The readout row address decoder inputs a readout address signal when the read enable signal RD is received, and decodes the readout address signal, and then outputs a readout row selection signal to select a line corresponding to the memory cell 5 as a target memory cell from which a data item will be read.

The readout column address decoder 4 receives the readout address signal when a read enable signal RD is received, and decodes the readout address signal, and then outputs a readout column selection signal to select a column of the memory cell as the target memory cell from which the data item will be read.

A plurality of the memory cells 5 forms a memory cell matrix in which each memory cell 5 is arranged in a matrix. Each memory cell comprises a flip-flop circuit 8 for storing a data item comprising inverter circuits I1 and I2, a readout transfer gate 9a, and write-in transfer gates 10a and 10b.

The readout transfer gate 9a comprises N-channel MOS FET connected between a readout data line 11 through which the data item stored in the flip flop circuit 8 is read out and an output terminal 12a of the flip flop circuit 8. The gate terminal of the readout transfer gate 9a is connected to a readout word line 13 to which the readout row selection signal transferred from the readout row address decoder 3 is provided. The operation of the gate terminal of the readout transfer gate 9a is controlled by the readout row selection signal.

The write-in transfer gates 10a and 10b comprises a N-channel MOS FETs connected in series between a write-in data line 14 to which a data item to be written into the flip flop circuit 8 is provided and an input terminal 12b of the flip flop circuit 8. The gate terminal of the write-in transfer gate 10a is connected to a write-in column line 15 to which the write-in column selection signal output from the write-in column address decoder 2 is provided. The operation of the gate terminal of the write-in transfer gate 10a is controlled by the readout row selection signal.

In the memory cell 5, the readout data line 11 is connected to a pre-charge transistor 17, so that the driving ability of the inverter circuit I1 is larger than that of the inverter circuit I2 and the threshold voltage of the inverter circuit I2 is increased in order to enhance its data storing characteristic.

The write-in control circuit 6 comprising a OR gate 18 and a buffer gate 19. The write-in control circuit 6 selectively outputs the write-in data item transferred from outside through the buffer gate 19 whose operation is controlled by the output of the OR gate 18 to the write-in data line 14 that is commonly used between the memory cells in adjacent rows to each other.

The buffer gate 19 in the write-in control circuit 6 and the inverter circuit I2 forming the flip flop 8 in the memory cell 5 has the following relationship in this embodiment:

The "gm" of the buffer gate 19>the "gm" of the inverter circuit I2, where "gm" is a mutual conductance. Thereby, the data write-in operation can be easily performed.

The data readout control circuit 7 comprises pre-charge transistors 17 for pre-charging the readout data lines 11 in synchronization with a pre-charge control signal and a buffer gate 20. The data readout control circuit 7 selectively outputs the stored data item on the readout data line 11 to outside through the buffer gate 20 whose operation is controlled by the readout column selection signal provided on the readout column line 21 by the readout column address decoder 4.

The description will now be given of the operation of the semiconductor memory device 100 of the first embodiment having the configuration described above.

When the write-in enable signal and the write-in address signal are provided to the write-in row address decoder 1 and the write-in column address decoder 2, respectively, the write-in row selection signal is output from the write-in row address decoder 1 and the write-in column selection signal is output from the write-in column address decoder 2. Thereby, one memory cell 5 having the transfer gate 10b activated by receiving the write-in row selection signal and the write-in transfer gate 10a activated by receiving the write-in column selection signal is accessed as the write-in target memory cell.

In this situation described above, the date item to be written into the target memory cell 5 is transferred onto the write-in data line 14 corresponding to this target memory cell 5 through the buffer gate 19 that is now activated by the write-in column selection signal provided from the write-in column address decoder 2. Then, the data item on the write-in data line 14 is written into the flip flop circuit 8 in the target memory cell 5 through the activated write-in transfer gates 10a and 10b.

As described above, in the write-in operation to the memory cell 5, the target memory cell is only one (that is, the number of the memory cells 5 to be connected to the write-in data line 14 is only one). That is, during the write-in operation, only one memory cell is connected electrically to the write-in data line 14.

Next, the description will now be given of the readout operation in the semiconductor memory device 100 as the first embodiment shown in FIG. 2.

When the readout enable signal and the readout address signal are provided to the readout row address decoder 3 and the readout column address decoder 4, respectively, the readout row selection signal is output from the readout row address decoder 3. All of the memory cells 5 in one line having the readout transfer gates 9a that are now activated by receiving the readout row selection signal. The data items stored in the selected memory cells 5 are readout to the corresponding readout data lines 11. That is, the data items stored in all of the memory cells 5 corresponding to the selected line are read onto the readout data lines 11 corresponding to the memory cells 5.

In this situation described above, the buffer gate 20 in the readout control circuit 7 is selected by the readout column selection signal output from the readout column address decoder 4. Thereby, the buffer gate 20 enters the active state. Then, through the buffer gate 20, the data item on the readout data line 11 is selected and output to outside.

As described above, according to the SRAM as the semiconductor memory device 100 of the first embodiment, the dedicated write-in address decoder for selecting a target memory cell to which data is written and the dedicated readout address decoder for selecting a target memory cell from which data is readout and the dedicated data write-in bus and the dedicated data readout bus are incorporated. In addition to this configuration, in the first embodiment, a pair of the write-in transfer gates (for example, the write-in transfer gates 10a and 10b) are provided for each memory cell 5 in order to access only one memory cell independently. Thereby, it is possible to execute both the date write-in operation and the data readout operation simultaneously. That is, during the data write-in operation, it is possible to perform the data readout operation of the memory cell whose address is same in the data write-in operation or different from the address in the data write-in operation. This causes to increase the speed of the memory access operation in the semiconductor memory device as the first embodiment when comparing with the conventional one.

When the SRAM as the semiconductor memory device 100 of the first embodiment is applied to a device for receiving information such as characters, pictures and the like and for displaying those information on a display device, it is possible to read those information and to display those information while receiving this information. That is, those information can be displayed on the display device in real-time when the semiconductor memory device of the first invention is used.

Furthermore, because only one memory cell as a target memory cell to which a data item is written is selected, the write-in data line 14 through which the write-in data item is provided to the memory cell 5 is commonly used between the memory cells 5 in the adjacent columns. It is thereby possible to decrease the chip size of the semiconductor memory device.

Second Embodiment

Figure 3:
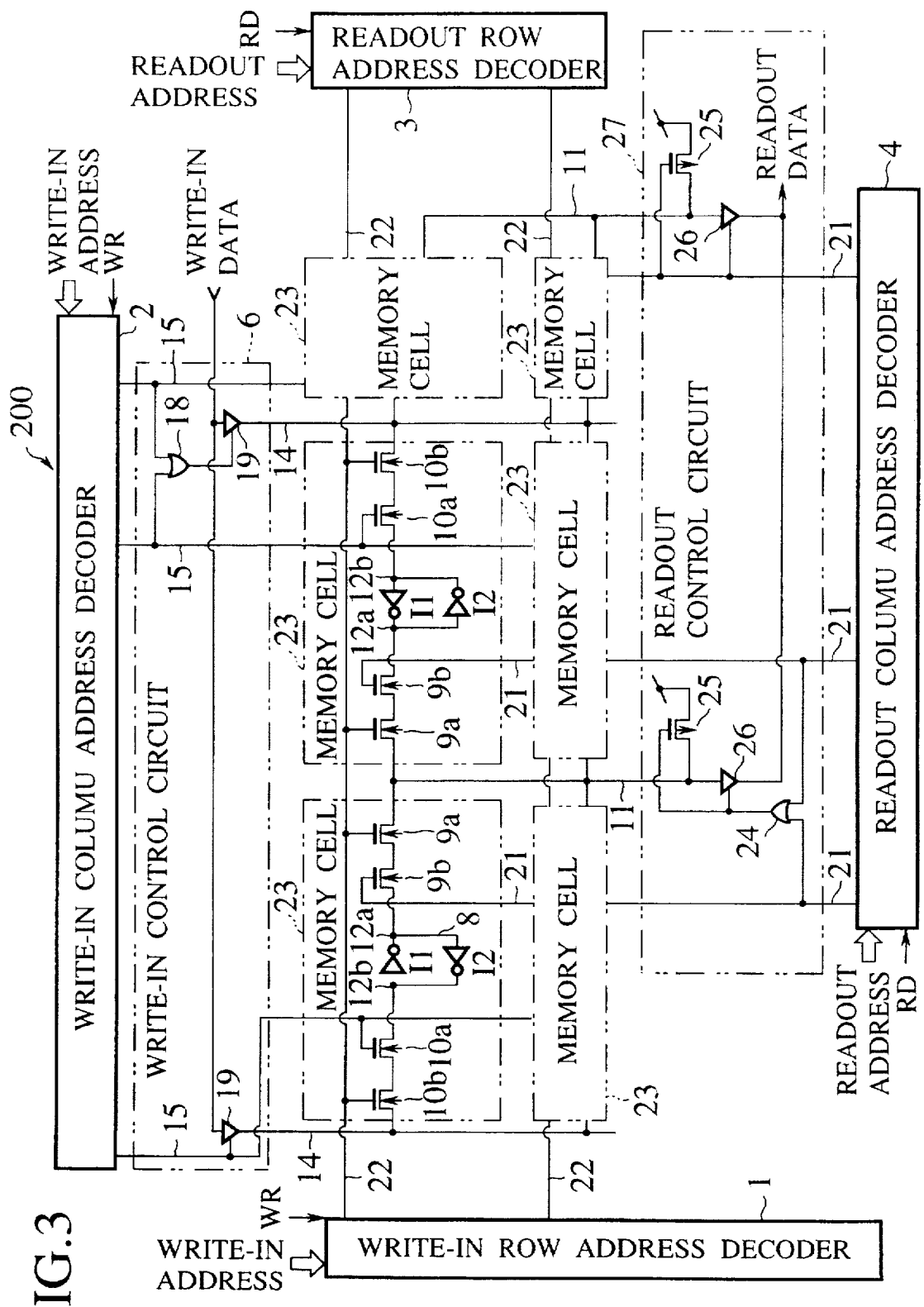
FIG. 3 is a diagram showing a configuration of a semiconductor memory device according to the second embodiment of the present invention.

FIG. 3 is a diagram showing the configuration of a semiconductor memory device 200 according to the second embodiment of the present invention.

In FIG. 23, the reference number 23 designates memory cells, 27 denotes the readout control circuit.

As the feature of the semiconductor memory device 200 of the second embodiment shown in FIG. 3, that is, the difference between the second embodiment and the first embodiment of the present invention is that the second embodiment has the configuration of the memory cell and the readout control circuit that is different from the configuration of those of the first embodiment. That is, only one memory cell as a target memory cell from which a data item is read can be selected (namely, it can be connected to the readout data line 11) during the data readout operation.. Specifically, the same configuration elements between the first embodiment and the second embodiment are used with the same reference numbers, therefore, the explanation of them is omitted here.

When comparing with the SRAM 100 of the first embodiment, the SRAM 200 of the second embodiment shown in FIG. 2 has the configuration as follows: A common readout word line 22 is incorporated instead of the readout word lines 12 and 16 shown in FIG. 2. In each memory cell 23, the transfer gates 9a and 9b are connected between the output terminal 12a of the flip flop circuit 8 and the readout data line 11. In the first embodiment, only the readout transfer gate 9a is incorporated shown in FIG. 2. The readout transfer gate 9b comprising a N-channel MOS transistor is connected in series to the readout transfer gate 9a. The gate terminal of the readout transfer gate 9b is connected to the readout column line 21. The readout data line 11 is commonly used by the memory cells in adjacent columns. Thereby, the data item read out onto the readout data line 11 can be selectively output to outside by the control of the readout control circuit 27 in which the operation of the pre-charge transistor 25 and the buffer gate 26 are controlled by the output from the OR gate 24 that receives the readout column selection signal corresponding to the adjacent memory cell 23. Other configuration of the semiconductor memory device 200 of the second embodiment are same as those of the semiconductor memory device 100 of the first embodiment shown in FIG. 2.

In the SRAM as the semiconductor memory device 200 of the second embodiment shown in FIG. 3, the data write-in operation is same as that of the SRAM 100 of the first embodiment.

On the other hand, in the data readout operation, the readout transfer gates 9a and 9b enter the active state when receiving the readout row selection signal output from the readout row address decoder 3 and the readout data column selection signal output from the readout column address decoder 4. Then, only the memory cell 23 corresponding to the activated readout transfer gates 9a and 9b is selected and accessed in all of the memory cells arranged in a matrix form. The accessed data item in the memory cell 23 is transferred to the readout data line 11 through the readout transfer gates 9a and 9b and provided to outside through the buffer gate 26 in the readout control circuit 27.

As described above, the semiconductor memory device 200 of the second embodiment further has the effect where only one memory cell 23 is accessed during the data readout operation, in addition to the effect of the semiconductor memory device 100 of the first embodiment shown in FIG. 2. Therefore, when comparing with the conventional semiconductor memory device in which all of memory cells in one line are accessed during the data readout operation, the semiconductor memory device 200 of the second embodiment has the effect that it is possible to reduce the power consumption of the semiconductor memory device.

Furthermore, according to the semiconductor memory device 200 of the second embodiment, the pre-charge operation for only the readout data lien 11 from which the data item stored in a target memory cell is read is stopped, that is, the pre-charge operation for other readout data lines from which no data is read is performed continuously. Therefore, when comparing with the conventional semiconductor memory device in which the pre-charge operation for all readout data lines are stopped during the data readout operation, it is possible to reduce the power consumption during the pre-charge operation in the semiconductor memory device.

Moreover, according to the semiconductor memory device 100 of the second embodiment, although the readout column line 21 must be formed in the memory cell array in order to provide the readout column selection signal to the readout transfer gate 9b for the memory cell 23, it is possible to commonly use the readout word line and the write-in word line because the readout transfer gate 9b is incorporated in each memory cell 23. In addition to this effect, it is also possible to commonly use the readout data line 11 for the memory cells in adjacent columns. Thereby, although the number of transistors forming each memory cell 23 is increased by one, it can be avoided to increase the size of the configuration of the semiconductor memory device 200 when comparing with the semiconductor memory device 100 of the first embodiment shown in FIG. 2. Further, because the data storing characteristic and the data writing characteristic are increased, it can be avoided to destroy the data item stored in the memory cell and to failure the data write-in operation.

As described above, according to the present invention, the dedicated address decoder for selecting one memory cell during the data write-in operation and the dedicated address decoder for selecting one memory cell during the data readout operation are incorporated in the semiconductor memory device. It is possible to perform both the data write-in operation and the data readout operation in the memory cell or the different memory cells simultaneously, because only one memory cell can be selected and accessed during the data write-in operation and the data readout operation by these dedicated address decoders. By this configuration, it can be achieved to perform the operation of the semiconductor memory device with high speed. In addition to this effect, it can be avoided to destroy the data item stored in the memory cell and to failure the data write-in operation.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor memory device comprising:
   a write-in row address decoder for outputting a write-in row selection signal to select a row of a memory cell to which a data item being written when receiving a write-in address signal;
   a write-in column address decoder for outputting a write-in column selection signal to select a column of the memory cell to which the data item being written when receiving the write-in address signal;
   a readout row address decoder for outputting a readout row selection signal to select a row of a memory cell from which a stored data item is read when receiving a readout address signal;

a plurality of memory cells for storing data, each memory cell comprising:

a readout column address decoder for outputting a readout column selection signal to select the column of the memory cell from which the stored data item is read when receiving the readout address signal; a flip flop for storing a data item;

a readout transfer gate; and first and second write-in transfer gates, wherein the readout transfer gate is connected to a readout data line through which the data item stored in the flip flop in the memory cell is read and an output terminal of the flip flop, and the operation of the readout transfer gate is controlled by the readout row selection signal output from the readout row address decoder, the first and second write-in transfer gates are connected between a write-in data line to which a data item to be written into the flip flop is provided and an input terminal of the flip flop, operation of the first write-in transfer gate is controlled by the write-in row selection signal output from the write-in row address decoder, and operation of the second write-in transfer gate is controlled by the write-in column selection signal output from the write-in column address decoder, a write-in control circuit for selectively transferring the write-in data item to the write-in data line based on the write-in column selection signal output from the write-in column address decoder; and a readout control circuit for selectively outputting the stored data item, based on the readout column selection signal output from the readout column address decoder, on the readout data line read from the memory cell in the row selected by the readout row selection signal output from the readout row address decoder.

2. A semiconductor memory device as claimed in claim 1, wherein the write-in data line is commonly used for adjacent memory cells.

3. A semiconductor memory device comprising:

a write-in row address decoder for outputting a write-in row selection signal to select a row of a memory cell to which a data item being written when receiving a write-in address signal;

a write-in column address decoder for outputting a write-in column selection signal to select a column of the memory cell to which the data item being written when receiving the write-in address signal;

a readout row address decoder for outputting a readout row selection signal to select a row of a memory cell from which a stored data item is read when receiving a readout address signal;

a readout row address decoder for outputting a readout column selection signal to select a column of the memory cell from which the stored data item is read when receiving the readout address signal;

a plurality of memory cells for storing data, each memory cell comprising:

a flip flop for storing a data item;

first and second readout transfer gates; and first and second write-in transfer gates, wherein the first and second readout transfer gates are connected in series to a readout data line through which the data item stored in the flip flop in the memory cell is read and an output terminal of the flip flop, operation of the first readout transfer gate is controlled by the readout row selection signal output from the readout row address decoder, operation of the second readout transfer gate is controlled by the readout column selection signal output from the readout column address decoder, the first and second write-in transfer gates are connected between a write-in data line to which a data item to be written into the flip flop is provided and an input terminal of the flip flop, operation of the first write-in transfer gate is controlled by the write-in row selection signal output from the write-in row address decoder, and operation of the second write-in transfer gate is controlled by the write-in column selection signal output from the write-in column address decoder, a write-in control circuit for selectively transferring the write-in data item to the write-in data line based on the write-in column selection signal output from the write-in column address decoder; and a readout control circuit for selectively outputting the stored data item on the readout data line read from the memory cell based on the readout column selection signal output from the readout column address decoder.

4. A semiconductor memory device as claimed in claim 3, wherein the word line is commonly used as the word line through which the readout row selection signal output from the readout row address decoder is provided to the first readout transfer gate and the word line through which the write-in row selection signal output from the write-in row address decoder is provided to the first write-in transfer gate.

5. A semiconductor memory device as claimed in claim 3, wherein the data line is commonly used as the readout data line and the write-in data line corresponding to the memory cells in adjacent columns.

6. A semiconductor memory device as claimed in claim 1, wherein the flip flop in the memory cell comprises a first inverter circuit and a second inverter circuit, and a driving ability of the first inverter circuit is greater than a driving ability of the second inverter circuit.

7. A semiconductor memory device as claimed in claim 2, wherein the flip flop in the memory cell comprises a first inverter circuit and a second inverter circuit, and a driving ability of the first inverter circuit is greater than a driving ability of the second inverter circuit.

8. A semiconductor memory device as claimed in claim 3, wherein the flip flop in the memory cell comprises a first inverter circuit and a second inverter circuit, and a driving ability of the first inverter circuit is greater than a driving ability of the second inverter circuit.

9. A semiconductor memory device as claimed in claim 4, wherein the flip flop in the memory cell comprises a first inverter circuit and a second inverter circuit, and a driving ability of the first inverter circuit is greater than a driving ability of the second inverter circuit.

10. A semiconductor memory device as claimed in claim 5, wherein the flip flop in the memory cell comprises a first inverter circuit and a second inverter circuit, and a driving ability of the first inverter circuit is greater than a driving ability of the second inverter circuit.

11. A semiconductor memory device as claimed in claim 6, wherein the write-in control circuit comprising a buffer gate, and the relationship between the buffer gate in the write-in control circuit and the second inverter circuit forming the flip flop in each memory cell is as follows:

mutual conductance gm of the buffer gate>mutual conductance gm of the second inverter circuit.

12. A semiconductor memory device as claimed in claim 7, wherein the write-in control circuit comprising a buffer gate, and the relationship between the buffer gate in the write-in control circuit and the second inverter circuit forming the flip flop in each memory cell is as follows:

mutual conductance gm of the buffer gate>mutual conductance gm of the second inverter circuit.

13. A semiconductor memory device as claimed in claim 8, wherein the write-in control circuit comprising a buffer gate, and the relationship between the buffer gate in the write-in control circuit and the second inverter circuit forming the flip flop in each memory cell is as follows:

mutual conductance gm of the buffer gate>mutual conductance gm of the second inverter circuit.

14. A semiconductor memory device as claimed in claim 9, wherein the write-in control circuit comprising a buffer gate, and the relationship between the buffer gate in the write-in control circuit and the second inverter circuit forming the flip flop in each memory cell is as follows:

mutual conductance gm of the buffer gate>mutual conductance gm of the second inverter circuit.

15. A semiconductor memory device as claimed in claim 10, wherein the write-in control circuit comprising a buffer gate, and the relationship between the buffer gate in the write-in control circuit and the second inverter circuit forming the flip flop in each memory cell is as follows:

mutual conductance gm of the buffer gate>mutual conductance gm of the second inverter circuit.

* * * * *